United States Patent
Chu et al.

(10) Patent No.: US 8,315,118 B2
(45) Date of Patent: Nov. 20, 2012

(54) PRECHARGE METHOD OF SEMICONDUCTOR MEMORY DEVICE AND SEMICONDUCTOR MEMORY DEVICE USING THE SAME

(75) Inventors: Yong-Gyu Chu, Hwaseong-si (KR); Woo-Pyo Jeong, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 272 days.

(21) Appl. No.: 12/767,830

(22) Filed: Apr. 27, 2010

(65) Prior Publication Data

US 2010/0271892 A1    Oct. 28, 2010

(30) Foreign Application Priority Data

Apr. 27, 2009  (KR) ................. 10-2009-0036571

(51) Int. Cl.
    *G11C 7/00*    (2006.01)
(52) U.S. Cl. .......................... 365/203; 365/63
(58) Field of Classification Search .................. 365/203, 365/230.06, 63
    See application file for complete search history.

(56) References Cited

U.S. PATENT DOCUMENTS

| 5,835,952 | A  | * | 11/1998 | Yamauchi et al. ............ 711/157 |
| 6,075,743 | A  |   | 6/2000  | Barth et al. |
| 6,088,292 | A  | * | 7/2000  | Takahashi ................ 365/233.14 |
| 6,125,432 | A  | * | 9/2000  | Hanami et al. ................ 711/157 |
| 6,671,836 | B1 | * | 12/2003 | Lai et al. ........................ 714/718 |
| 2001/0037428 | A1 | * | 11/2001 | Hsu et al. ...................... 711/105 |
| 2007/0047361 | A1 | * | 3/2007  | Okada ............................ 365/222 |
| 2008/0123451 | A1 | * | 5/2008  | Rao ................................ 365/203 |

FOREIGN PATENT DOCUMENTS

| JP | 2007-066382 | 3/2007 |
| KR | 1020050104059 | 11/2005 |
| KR | 1020070009821 | 1/2007 |

* cited by examiner

*Primary Examiner* — Michael Tran
(74) *Attorney, Agent, or Firm* — F. Chau & Associates, LLC

(57) ABSTRACT

A precharge method of a semiconductor memory device that controls a precharge start time of each bank during a bank precharge operation, and a semiconductor memory device using the method, are provided. The device may latch an active or write order of respective banks and differently control precharge start times of the respective banks according to the latched active or write order during a plural-bank precharge operation to allow a plurality of banks to start precharge operations at different times.

16 Claims, 7 Drawing Sheets

PRECHARGE METHOD OF SEMICONDUCTOR MEMORY DEVICE AND SEMICONDUCTOR MEMORY DEVICE USING THE SAME

CROSS-REFERENCE TO RELATED APPLICATION

This application claims under 35 U.S.C. §119 priority to and the benefit of Korean Patent Application No. 10-2009-0036571, filed on Apr. 27, 2009, the entire content of which is incorporated by reference herein.

BACKGROUND

1. Technical Field

The present disclosure relates to semiconductor devices, and, more particularly, to a precharge method for a semiconductor memory device and a semiconductor memory device using the same.

2. Discussion of Related Art

Semiconductor memory devices, particularly dynamic random access memories (DRAMs), typically need a precharge operation to perform normal operations.

Due to a demand for increasing the integration density of semiconductor memory devices, the semiconductor memory devices have been made with a multiple bank structure. In response to a precharge command, a semiconductor memory device having a plurality of banks may perform not only a precharge operation of precharging each bank but also an all-bank precharge operation wherein all banks are precharged at once.

The precharge operation may involve applying a bank address BA for a bank to be precharged along with the precharge command to the semiconductor memory device. Also, the all-bank precharge operation may involve applying an all-bank precharge command even without applying the bank address BA.

The corresponding bank may receive an active command ACT and then be precharged after a row active time tRAS has elapsed. The row active time tRAS may be defined as the sum of the time taken for a sense amplifier to finish a sensing operation in response to a row address RA after the application of the active command ACT and the time taken to perform a data read or write operation.

The all-bank precharge command may be typically executed to initialize a semiconductor memory device before a mode register set (MRS) is changed or before the semiconductor memory device enters an auto-refresh or self-refresh mode. As described above, each bank may receive an active command and then be precharged after a row active time tRAS has elapsed, and the all-bank precharge command may allow all the banks to be precharged. Thus, a conventional semiconductor memory device may receive an all-bank precharge command, delay the all-bank precharge command for a predetermined time irrespective of a state of each bank, and perform an all-bank precharge operation.

However, since all banks of a semiconductor memory device may be precharged simultaneously during an all-bank precharge operation, a very large amount of power consumption may occur in an initial period of the precharge operation. The power consumption may add noise to the power supply voltage, thereby increasing the duration of the precharge operation or precluding a normal precharge operation. Also, even during a precharge operation of each bank, when a plurality of banks are precharged simultaneously, noise may occur in the power supply voltage. In addition, when each bank includes a large number of memory cells and all blocks of the bank are precharged simultaneously, noise may occur in the power supply voltage.

SUMMARY

Exemplary embodiments provide a precharge method of a semiconductor memory device in which precharge start times of a plurality of banks may be controlled differently during an all-bank precharge operation or plural-bank precharge operation.

Also, exemplary embodiments provide a semiconductor memory device using the above-described method.

According to an exemplary embodiment, a precharge method of a semiconductor memory device including n banks, n being a natural number equal to or greater than 2, includes: latching an active order of the n banks in response to a bank address applied along with an active command when the active command is applied; determining whether or not a precharge command is given to precharge m banks, m being a natural number equal to or greater than 2 and equal to or less than n, when the precharge command is applied, setting the number of banks to be precharged simultaneously to i, i being a natural number equal to or greater than 1 and equal to or less than m, when the precharge command is given to precharge the m banks, determining a precharge order of the respective m banks based upon the latched active order and sequentially activating m final precharge signals in groups of i according to the determined precharge order, and starting precharging the m banks at different times in response to the sequentially activated m final precharge signals.

The precharge method may further include latching a write order of the n banks in response to the bank address applied along with a write command when the write command is applied.

Activating the final precharge signals may include determining the precharge order of the respective m banks based upon the latched active order and the latched write order.

The precharge command given to precharge the plurality of banks may be an all-bank precharge command for precharging all the n banks.

The precharge command given to precharge the m banks may be applied simultaneously with bank addresses for the m banks.

Starting precharging the m banks may include: determining whether or not a plurality of blocks included in each of the banks corresponding the activated final precharge signals are to be precharged in block units, precharging all the blocks included in each of the banks simultaneously when the blocks are not to be precharged in block units, determining the number of the blocks to be precharged simultaneously when the blocks are to be precharged in block units, and sequentially precharging the plurality of blocks included in each of the banks by the determined number of blocks to be precharged simultaneously.

The precharge method may further include: determining whether or not the plurality of blocks included in each of the banks to be precharged are to be precharged in block units when the precharge command is a single-bank precharge command, simultaneously precharging all the blocks included in each of the banks when the plurality of blocks are not to be precharged in block units, determining the number of the blocks to be precharged simultaneously when the plurality of blocks are to be precharged in block units, and sequentially precharging the plurality of blocks included in each of the banks by the determined number of blocks to be precharged simultaneously.

According to an exemplary embodiment, a semiconductor memory device includes: n banks, n being a natural number equal to or greater than 2, a command decoder configured to decode an externally applied command and output an active command and a precharge command, and a precharge controller configured to receive a bank address and the active command, latch an active order of the n banks, and output m final precharge signals, which are activated at different start times in groups of i, i being a natural number equal to or greater than 1 and equal to or less than m and m being a natural number equal to or greater than 2 and equal to or less than n, according to the latched active order when the precharge command for precharging m banks is applied. The n banks start precharge operations in response to the corresponding m final precharge signals.

The precharge controller may include: an active order latch unit configured to receive the bank address and the active command, latch the active order of the n banks, and activate the n final bank active signals according to the latched active order, a precharge order determiner configured to determine a precharge order of the n banks in response to the n final bank active signals, activate n precharge priority signals according to the determined precharge order, and output the activated precharge priority signals, and a final precharge signal generator configured to activate the m final precharge signals at different start times in groups of i in response to the n precharge priority signals and the precharge command.

The precharge controller may further include a write order latch unit configured to receive the bank address and a write command, which is further output from the command decoder, latch a write order of the n banks, and output n final bank write signals according to the latched write order. The precharge order determiner may output the n precharge priority signals in response to the n final bank write signals and the n final bank write signals.

The active order latch unit may include n active latch units. Each of the n active latch units may include: a first AND gate configured to perform a logic AND on the corresponding bank address and the active command and output a corresponding bank active signal, a first OR gate configured to perform a logic OR on the bank active signals other than the corresponding bank active signal, and a first flip-flop configured to activate the corresponding final bank active signal in response to the output signal of the first AND gate, deactivate the final bank active signal in response to the output signal of the first OR gate.

The write order latch unit may include n write latch units. Each of the n write latch units may include: a second AND gate configured to perform a logic AND on the corresponding bank address and the write command and output a corresponding bank write signal, a second OR gate configured to perform a logic OR on the bank write signals other than the corresponding bank write signal, and a second flip-flop configured to activate the corresponding final bank write signal in response to the output signal of the second AND gate, deactivate the final bank write signal in response to the output signal of the second OR gate.

The precharge order determiner may include n precharge priority signal generators. Each of the n precharge priority signal generators may include: a third AND gate configured to receive the final bank active signal and the final bank write signal, which correspond to one of the banks other than the corresponding bank, perform a logic AND on the received signals, and a third OR gate configured to perform a logic OR on the output signal of the third AND gate, the corresponding final bank active signal, and the corresponding final bank write signal, and output the precharge priority signal. The n third AND gates may receive respectively different final bank active signals and final bank write signals.

The final precharge signal generator may include n final precharge generators. Each of the n final precharge generators may include: a fourth AND gate configured to perform a logic AND on the bank precharge command and the corresponding one of the n precharge priority signals, a fourth OR gate configured to perform a logic OR on a bank precharge signal, which is generated by combining the corresponding bank address with the precharge command further output from the command decoder, and the output signal of the fourth AND gate, and output a precharge control signal, a delay unit configured to delay the precharge control signal for a predetermined delay time, and output a delayed precharge control signal, a first inverter configured to invert the corresponding precharge priority signal, and output an inverted precharge priority signal, a fifth AND gate configured to perform a logic AND on the output signal of the first inverter and an all-bank precharge command, a fifth OR gate configured to perform a logic OR on the delayed precharge control signal and the output signal of the fifth AND gate, and a third flip-flop configured to deactivate the corresponding final precharge signal in response to the corresponding bank active signal, activate the corresponding final precharge signal in response to the output signal of the fifth OR gate.

According to an exemplary embodiment, a semiconductor memory array device includes: a memory cell array comprising a plurality of memory banks; a plurality of row decoders coupled to respective memory banks, the row decoders being responsive to a bank selection signal that activates a row decoder in response to a bank address, and a row address signal; and a pre-charge controller responsive to the bank address and commands, including at least a bank precharge command for pre-charging individual banks and an all-bank precharge command for precharging all banks. When the all-bank precharge command or the bank precharge command is applied to the pre-charge controller the precharge controller determines the precharge order of the plurality of banks to be precharged, activates a plurality of precharge signals corresponding respectively to the plurality of banks such that the respective banks are precharged according to a determined precharge order, and outputs the activated precharge signals to the row decoder.

The precharge controller may control an activation start time of the bank precharge signal such that during the all-bank precharge operation selected banks are precharged before remaining banks are precharged.

The precharge controller may control an activation start time of the bank precharge signal such that during a simultaneous precharge operation of a plurality of banks, some of the plurality of banks are precharged before remaining banks are precharged.

The memory cell array may include a plurality of word lines disposed in a row direction, a plurality of bit lines disposed in a column direction, and memory cells disposed at respective intersections between the word lines and the bit lines.

BRIEF DESCRIPTION OF THE DRAWINGS

Exemplary embodiments are described in further detail below with reference to the accompanying drawings. It should be understood that various aspects of the drawings may have been exaggerated for clarity.

DETAILED DESCRIPTION OF THE EMBODIMENTS

Various exemplary embodiments will now be described more fully with reference to the accompanying drawings.

A semiconductor memory device according to an exemplary embodiment may include a precharge controller, which may latch an active order or write order of a plurality of banks and differently control precharge start times of the respective banks during a bank precharge operation according to the latched order.

Figure 1:
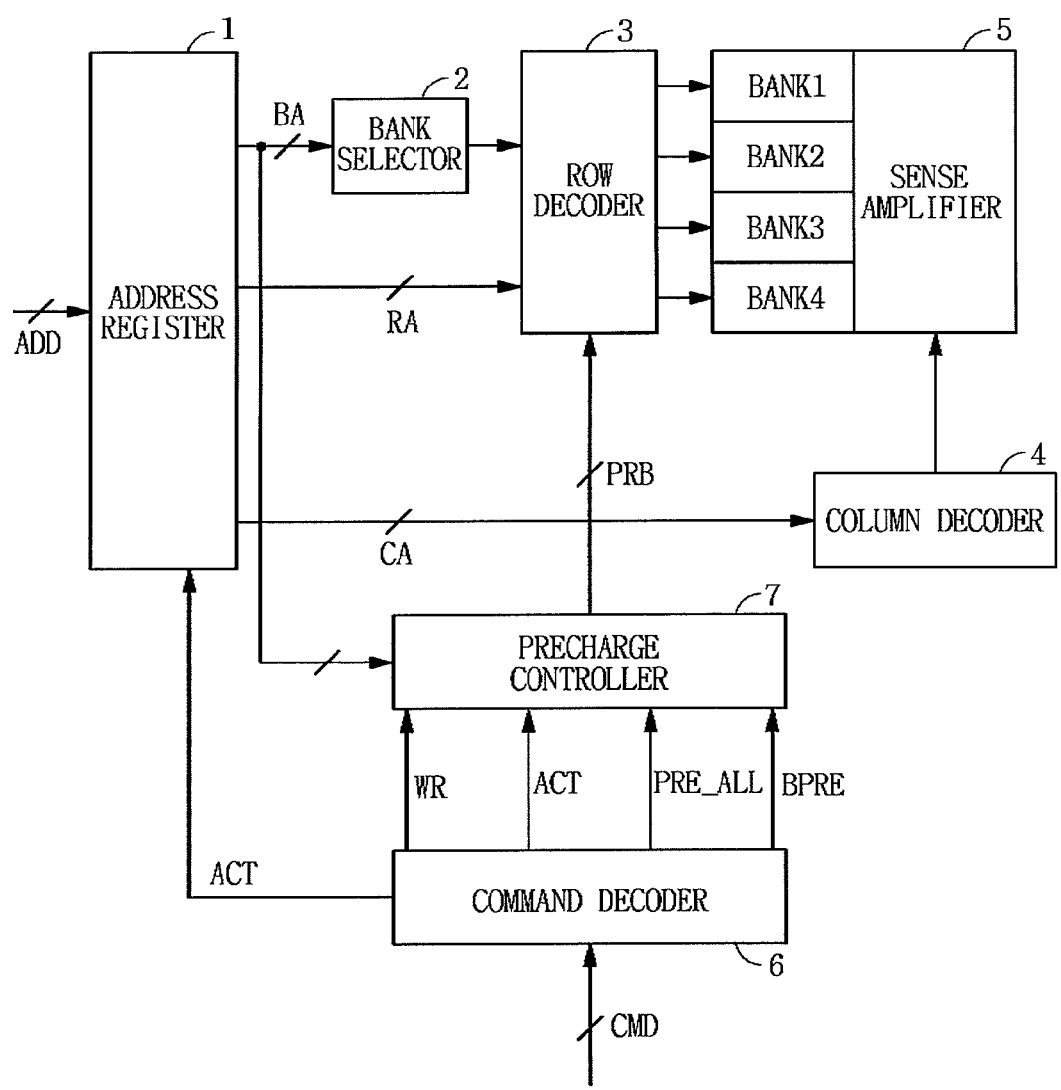
FIG. 1 is a diagram of a semiconductor memory device according to an exemplary embodiment.

FIG. 1 is a diagram of a semiconductor memory device according to an exemplary embodiment. An address register 1 may externally receive an address in response to an active command ACT applied from a command decoder 6 during an active operation, divide the address ADD into a bank address BA, a row address RA, and a column address CA, and transmit the bank address BA, the row address RA, and the column address CA to a bank selector 2, a row decoder 3, and a column decoder 4, respectively.

The bank selector 2 may activate the corresponding one of a plurality of row decoders 3 in response to the bank address BA. The plurality of row decoders 3 may designate respective banks of a memory cell array 5, and the row decoder 3 activated by the bank selector 2 may receive the row address RA from the address register 1 and designate a specific row of the corresponding bank. The column decoder 4 may receive the column address from the address register 1, decode the column address CA, and designate a specific column of the memory cell array 5.

The memory cell array 5 may include a plurality of word lines disposed in a row direction, a plurality of bit lines disposed in a column direction, memory cells disposed at respective intersections between the word lines and the bit lines, and a sense amplification unit including a plurality of sense amplifiers configured to sense and amplify data. In the memory cell array 5, memory cells disposed on a word line selected by the row decoder 3 may be selected, and a sense amplifier selected by the column decoder 4 may sense and amplify data of a specific memory cell out of the memory cells of the selected word line.

The command decoder 6 may decode an externally applied command CMD and output a write command WR, an active command ACT, a bank precharge command BPRE for precharging individual banks, and an all-bank precharge command PRE_ALL for precharging all banks.

The precharge controller 7 may receive the active command ACT, the bank precharge command BPRE, the all-bank precharge command PRE_ALL, and the write command WR from the command decoder 6 and receive the bank address BA from the address register 1. The precharge controller 7 may latch an active order of a plurality of banks in response to the bank address BA applied along with the active command ACT and latch a write order of the plurality of banks in response to the bank address BA applied along with the write command WR. When the all-bank precharge command PRE_ALL is applied or the bank precharge command BPRE is applied along with the plurality of bank addresses BA, the precharge controller 7 may determine the precharge order of the plurality of banks to be precharged based upon the latched write order and the latched active order, activate a plurality of final precharge signals PRB corresponding respectively to the plurality of banks so that the respective banks may be precharged according to the determined precharge order, and output the activated final precharge signals PRB to the row decoder 3.

Figure 2:
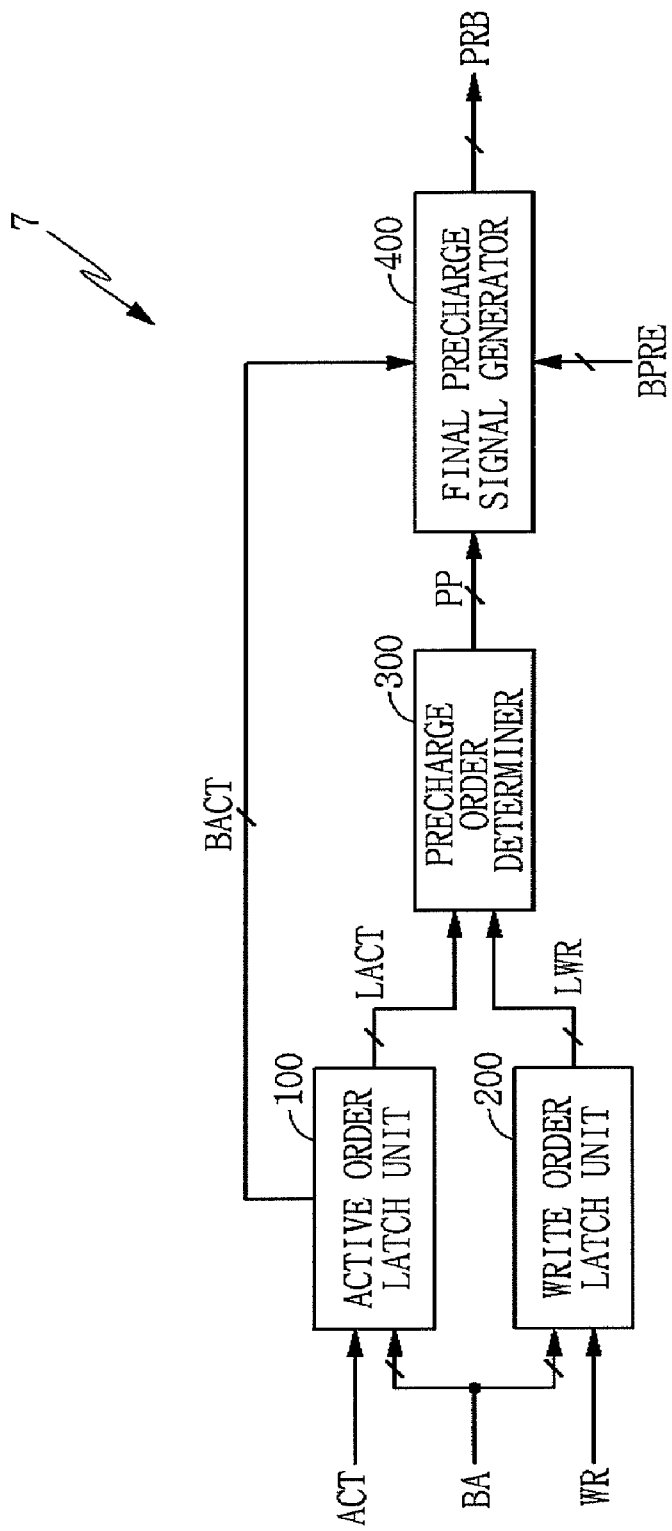
FIG. 2 is a diagram of the precharge controller of FIG. 1, according to an exemplary embodiment.

FIG. 2 is a diagram of the precharge controller of FIG. 1, according to an exemplary embodiment. The precharge controller 7 may include an active order latch unit 100, a write order latch unit 200, a precharge order determiner 300, and a final precharge signal generator 400.

The active order latch unit 100 may receive the active command ACT from the command decoder 6, receive the bank address BA from the address register 1 to generate a bank active signal BACT for activating each bank, latch the order of the activation of a plurality of banks of the semiconductor memory device, and output a final bank active signal LACT to the precharge order determiner 300. The final bank active signal LACT may include information on a finally activated bank.

Similarly, the write order latch unit 200 may receive a write command WR from the command decoder 6, receive the bank address BA from the address register 1, latch a write order of the plurality of banks 5 of the semiconductor memory device, and output a final bank write signal LWR to the precharge order determiner 300. The final bank write signal LWR may include information on a finally written bank.

In response to the final bank active signal LACT and the final bank write signal LWR, the precharge order determiner 300 may determine an order in which respective banks start a precharge operation during an all-bank precharge operation and output a precharge priority signal PP to the final precharge signal generator 400.

The final precharge signal generator 400 may control the precharge start time of each bank in response to the bank active signal BACT, which is applied from the active order latch unit 100, the bank precharge signal BPRE, and the precharge priority signal PP, and generate a final bank precharge signal PRB.

Although the number of the banks included in the semiconductor memory device may vary, the present exemplary embodiment will be described as having four banks. Also, the precharge controller 7 may control the activation start time of the final bank precharge signal PRB such that during the all-bank precharge operation, a finally activated bank and a finally written bank of the four banks may be precharged later and the remaining banks may be precharged first. Also, even if the all-bank precharge operation is not performed, when a plurality of banks are precharged simultaneously, the precharge controller 7 may control the activation start time of the final bank precharge signal PRB such that some of the plurality of banks are precharged first and the remaining banks are precharged later.

Figure 3:
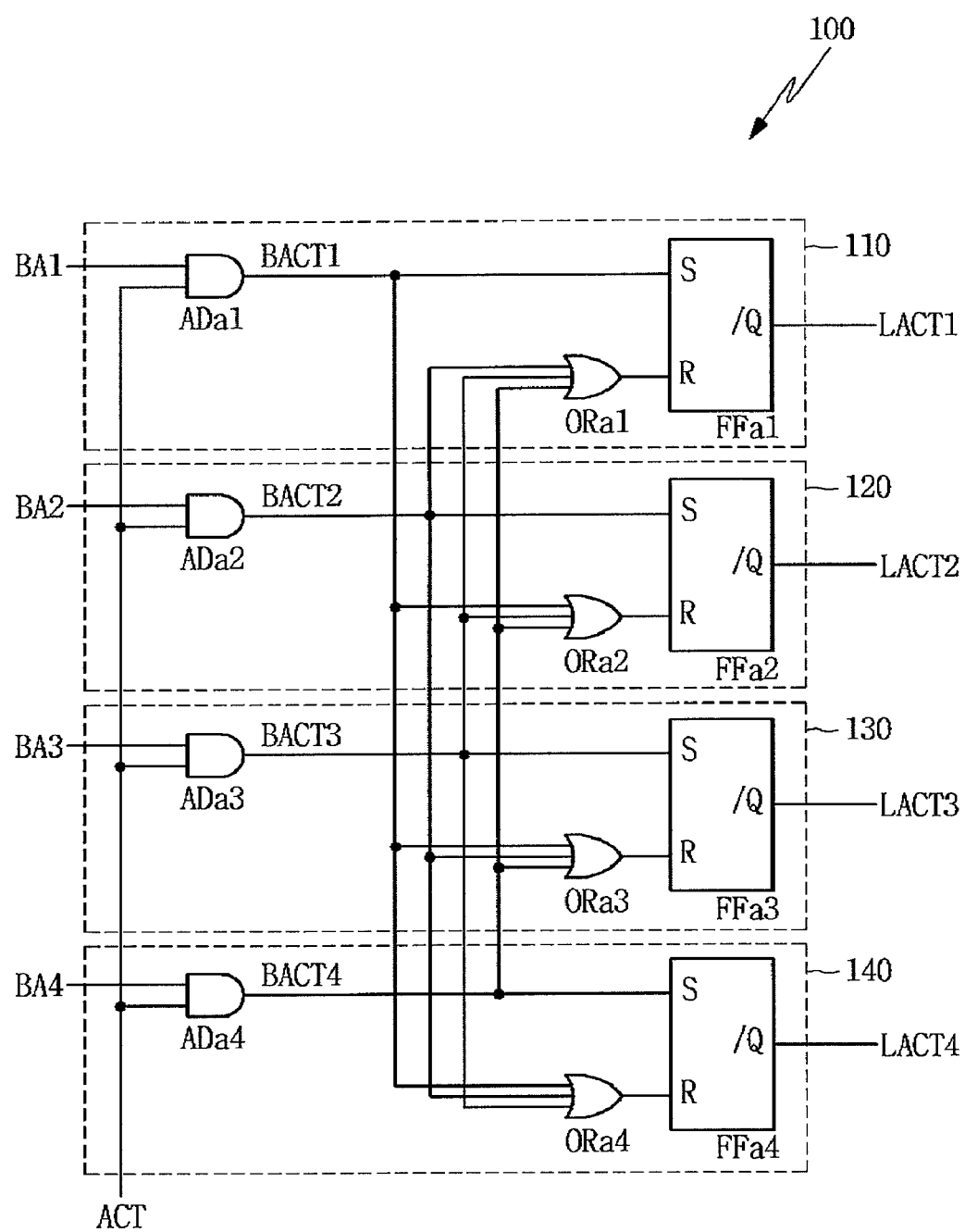
FIG. 3 is a diagram of the active order latch unit of FIG. 2, according to an exemplary embodiment.

FIG. 3 is a diagram of the active order latch unit 100 of FIG. 2, according to an exemplary embodiment. Since the exemplary embodiment of the semiconductor memory device includes four banks, the active order latch unit 100 of FIG. 3 may include first through fourth active latch units 110, 120, 130, 140 corresponding to respective banks. Also, the first through fourth active latch units 110, 120, 130, 140 may include AND gates ADa1, ADa2, ADa3, ADa4, OR gates ORa1, ORa2, ORa3, ORa4, and flip-flops FFa1, FFa2, FFa3, FFa4, respectively.

The plurality of AND gates ADa1, ADa2, ADa3, ADa4 may receive the corresponding bank addresses BA1, BA2, BA3, BA4 from the address register (refer to 1 in FIG. 1), perform a logic AND on the corresponding bank addresses BA1, BA2, BA3, BA4 and the active command ACT applied from the command decoder 6, and activate and output a plurality of bank active signals BACT1, BACT2, BACT3, BACT4 for designating the activation of the corresponding banks. The plurality of OR gates ORa1, ORa2, ORa3, ORa4 may receive bank active signals other than the corresponding ones of the plurality of bank active signals BACT1, BACT2, BACT3, BACT4, perform a logic OR on the received signals. For example, the OR gate ORa1 of the first active latch unit 110 may receive the second through fourth bank active signals BACT2, BACT3, BACT4, excluding the corresponding first bank active signal BACT1, perform a logic OR on the second through fourth bank active signals BACT2, BACT3, BACT4, and output a logic OR output signal. The plurality of flip-flops FFa1, FFa2, FFa3, FFa4, which are embodied by SR flip-flops, may receive the corresponding bank active signals BACT1, BACT2, BACT3, BACT4 through the set terminals S thereof, receive the output signals of the corresponding OR gates ORa1, ORa2, ORa3, ORa4 through the reset terminals R thereof, latch the received signals, and output final bank active signals LACT1, LACT2, LACT3, LACT4, respectively.

The operation of the active order latch unit 100 will now be described with reference to FIG. 3. Initially, when the command decoder 6 decodes an externally applied command to apply the active command ACT and designates a bank corresponding to the bank address BA out of addresses applied to the address register 1, the corresponding bank active signal may be activated, while the remaining bank active signals may be deactivated.

For example, when the applied bank address BA is the bank address BA1 for a first bank, only a first bank active signal BACT1 may be activated, and second through fourth bank active signals BACT2, BACT3, BACT4 may be deactivated. Thus, the OR gate ORa1 of the first active latch unit 110 may output a low-level signal, while the OR gates ORa2, ORa3, ORa4 of the second through fourth active latch units 120, 130, 140 may output high-level signals. Since the activated first bank active signal BACT1 is applied to a set terminal S of the flip-flop FFa1 and the low-level signal is applied from the OR gate ORa1 to a reset terminal R thereof, the first active latch unit 110 may activate and output a final bank active signal LACT1. By comparison, since deactivated bank active signals BACT2, BACT3, BACT4 are respectively applied to set terminals S of the flip-flops FFa2, FFa3, FFa4 and the high-level signals are applied from the OR gates ORa2, ORa3, ORa4 thereof to reset terminals R thereof, the second through fourth active latch units 120, 130 140 may deactivate and output second through fourth final bank active signals LACT2, LACT3, LACT4, respectively.

Afterwards, when the bank address BA3 for a third bank is applied along with the active command ACT, the third active latch unit 130 may activate and output a third final bank active signal LACT3, while the remaining active latch units 110, 120, 140 may output deactivated final bank active signals LACT1, LACT2, LACT4, respectively.

As a result, the active order latch unit 100 may activate only a final bank active signal corresponding to a finally activated bank out of the plurality of banks, and deactivate final bank active signals corresponding to the remaining banks.

Figure 4:
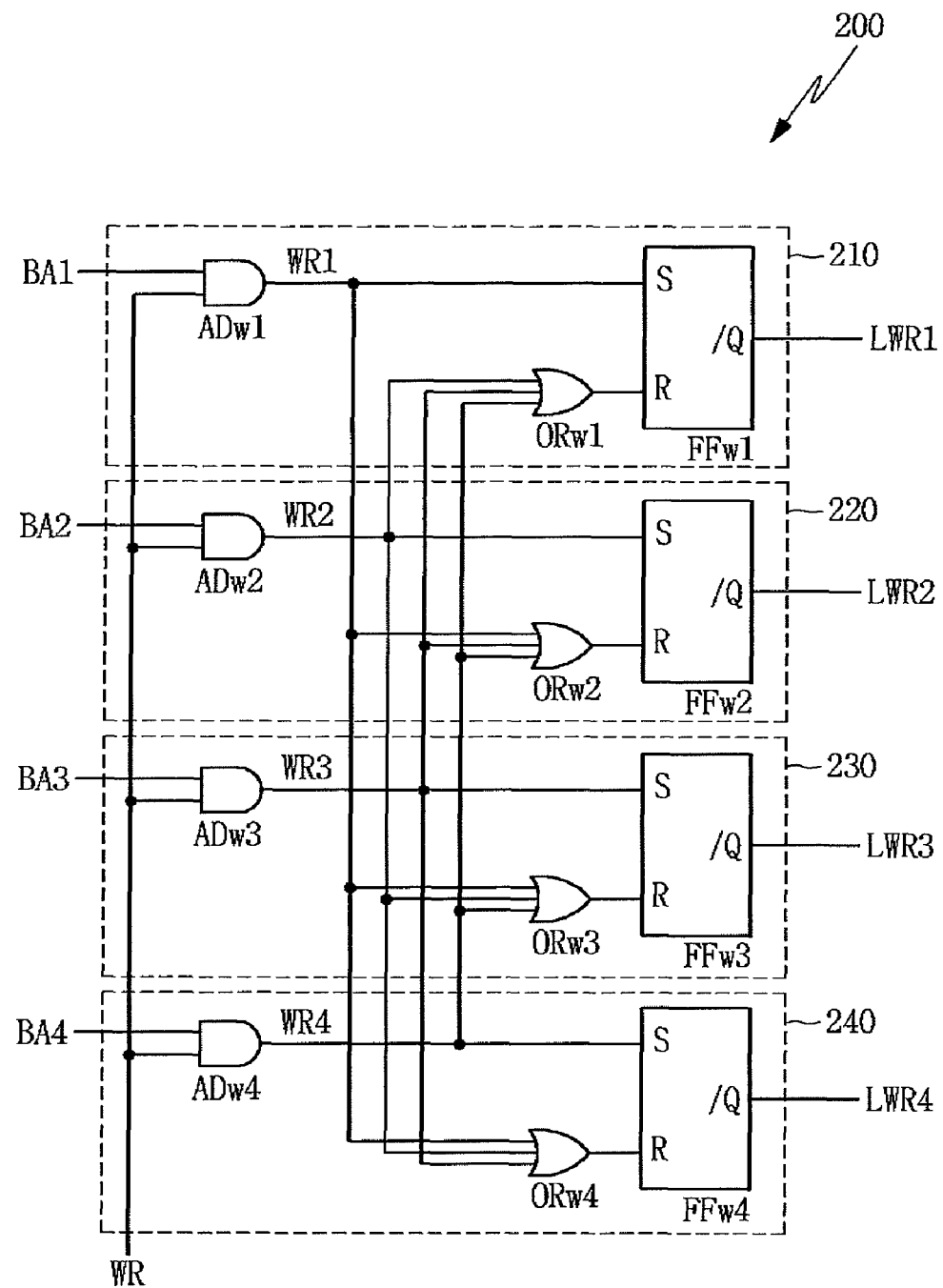
FIG. 4 is a diagram of the write order latch unit of FIG. 2, according to an exemplary embodiment.

FIG. 4 is a diagram of the write order latch unit 200 of FIG. 2, according to an exemplary embodiment. Like the active order latch unit 100, the write order latch unit 200 may include first through fourth write latch units 210, 220, 230, 2240 corresponding to the respective banks. Also, the first through fourth write latch units 210, 220, 230, 2240 may include AND gates ADw1, ADw2, ADw3, ADw4, OR gates ORw1, ORw2, ORw3, ORw4, and flip-flops FFw1, FFw2, FFw3, FFw4, respectively. The first through fourth write latch units 210, 220, 230, 240 may have the same configurations as the first through fourth active latch units 110, 120, 130, 140, respectively, except that each of the first through fourth write latch units 210, 220, 230, 240 receives the write command WR instead of the active command ACT from the command decoder 6.

The plurality of logic AND gates ADw1, ADw2, ADw3, ADw4 may receive the bank addresses BA1, BA2, BA3, BA4 corresponding to the address register 1, perform a logic AND on the corresponding bank addresses BA1, BA2, BA3, BA4 and the write command WR applied from the command decoder 6, activate a plurality of bank write signals WR1, WR2, WR3, WR4 for designating the activation of the corresponding banks, respectively, and output the activated signals. The plurality of OR gates ORw1, ORw2, ORw3, ORw4 may receive bank write signals other than the corresponding bank write signal out of the plurality of bank write signals WR1, WR2, WR3, WR4, perform a logic OR on the received signals. The plurality of flip-flops FFw1, FFw2, FFw3, FFw4, which are embodied by SR flip-flops, may receive the corresponding bank write signals through the set terminals S thereof, receive the corresponding logic OR output signals through the reset terminals R thereof, latch the received signals, and output final bank write signals LACT1, LACT2, LACT3, LACT4, respectively.

As a result, the write order latch unit 200 of FIG. 4 may operate in about the same manner as the active order latch unit 100 of FIG. 3. Thus, the write order latch unit 200 may activate only the final bank write signal corresponding to a finally written bank out of the plurality of banks, and deactivate the final bank write signals corresponding to the remaining banks.

Figure 5:
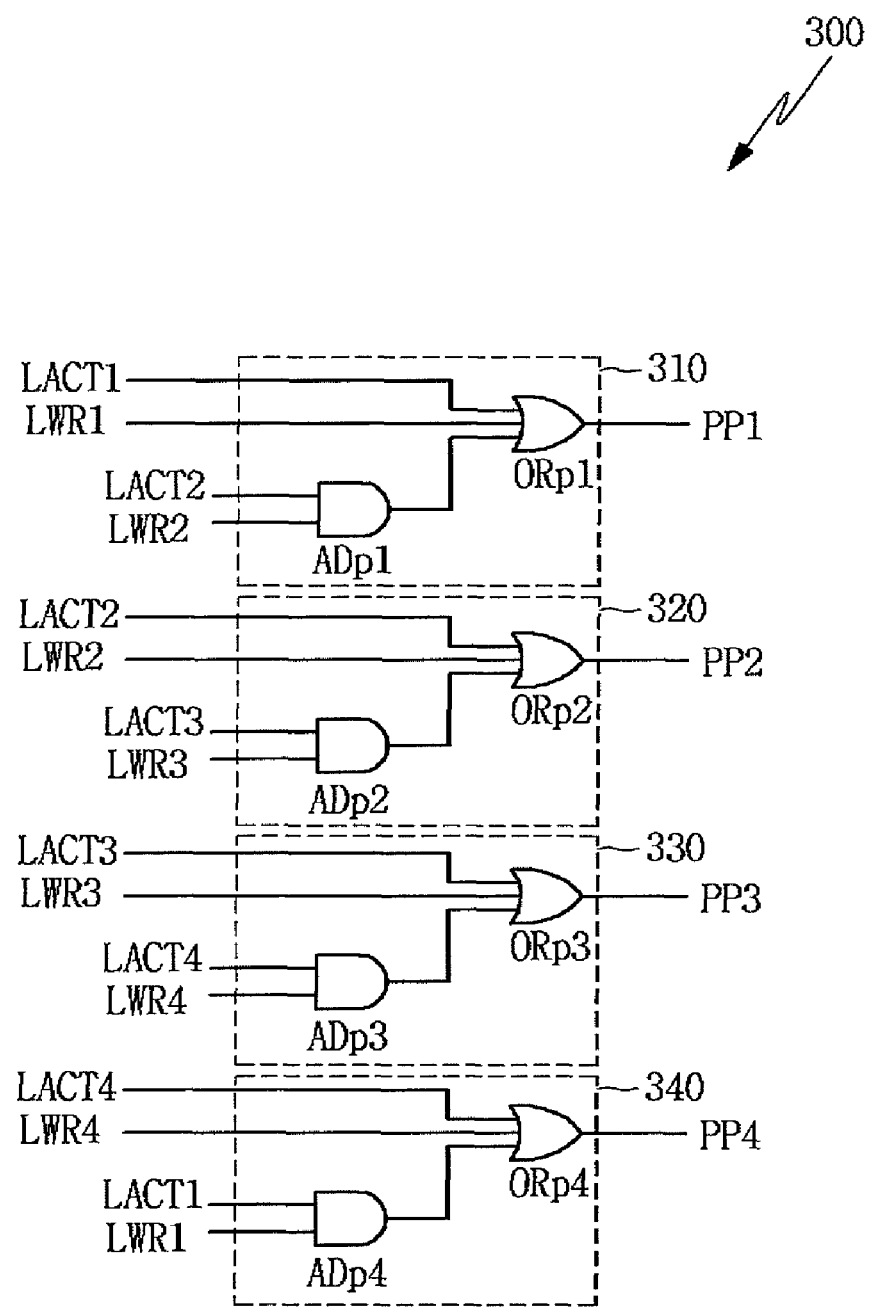
FIG. 5 is a diagram of the precharge order determiner of FIG. 2, according to an exemplary embodiment.

FIG. 5 is a diagram of the precharge order determiner 300 of FIG. 2, according to an exemplary embodiment. The precharge order determiner 300 may include first through fourth precharge priority signal generators 310, 320, 330, 340, which include AND gates ADp1, ADp2, ADp3, ADp4 and OR gates ORp1, ORp2, ORp3, ORp4, respectively. Each of the AND gates ADp1, ADp2, ADp3, ADp4 may perform a logic AND on a final bank active signal and a final bank write signal, which are applied to one of banks other than the corresponding one of the plurality of banks, and output a logic AND output signal. In this case, the AND gates ADp1, ADp2, ADp3, ADp4 may receive the final bank active signals LACT1, LACT2, LACT3, LACT4 and the final bank write signals LWR1, LWR2, LWR3, LWR4, which correspond to different banks, and perform a logic AND on the received signals. For example, referring to FIG. 5, the AND gates ADp1, ADp2, ADp3 may receive the third through fourth final bank active signals LACT2, LACT3, LACT4 and the second through fourth final bank write signals LWR2, LWR3, LWR4, respectively, and the AND gate ADp4 may receive the first final bank active signal LACT1 and the first final bank write signal LWR1. Also, the OR gates ORp1, ORp2, ORp3, ORp4 may respectively receive the final bank active signals LACT1, LACT2, LACT3, LACT4 and the final bank write signals LWR1, LWR2, LWR3, LWR4, which correspond to the respective banks, and the output signals of the AND gates ADp1, ADp2, ADp3, ADp4, perform a logic OR on the received signals, and output first through fourth precharge priority signals PP1, PP2, PP3, PP4. The precharge priority signals PP1, PP2, PP3, PP4 may be signals for designating a bank to be precharged first during a bank precharge operation and a bank to be precharged later during the bank precharge operation.

When a finally activated bank of the plurality of banks corresponds to a finally written bank, an activated bank active signal out of the final bank active signals LACT1, LACT2, LACT3, LACT4 and an activated bank write signal out of the final bank write signals LWR1, LWR2, LWR3, LWR4 may designate the same bank. Thus, during the bank precharge operation, the number of banks to be precharged first may differ from the number of banks to be precharged later. The precharge order determiner 300 may be an additional circuit for equalizing the number of banks to be precharged first to the number of banks to be precharged later when the finally activated bank is the same as the finally written bank.

If the precharge order determiner 300 does not include the AND gates ADp1, ADp2, ADp3, ADp4, when the fourth final bank active signal LACT4 and the fourth final bank write signal LWR4 are activated and applied, the finally activated bank and the finally written bank may both be the fourth bank. Thus, only the fourth precharge priority signal PP4 may be deactivated, and the first through third precharge priority signals PP1, PP2, PP3 may be activated so that the first through third banks may be precharged first and only the fourth bank may be precharged later. In this case, since the three banks are precharged simultaneously, problems, such as power noise, may occur as described above. However, when the precharge order determiner 300 includes the AND gates ADp1, ADp2, ADp3, ADp4, the third precharge priority signal generator 330 of the precharge order determiner 300 may receive the fourth final bank active signal LACT4 and the fourth final bank write signal LWR4 and deactivate the third precharge priority signal PP3. Thus, the first and second precharge priority signals PP1, PP2 may be activated to a low level, and the third and fourth precharge priority signals PP3, PP4 may be deactivated to a high level.

Figure 6:
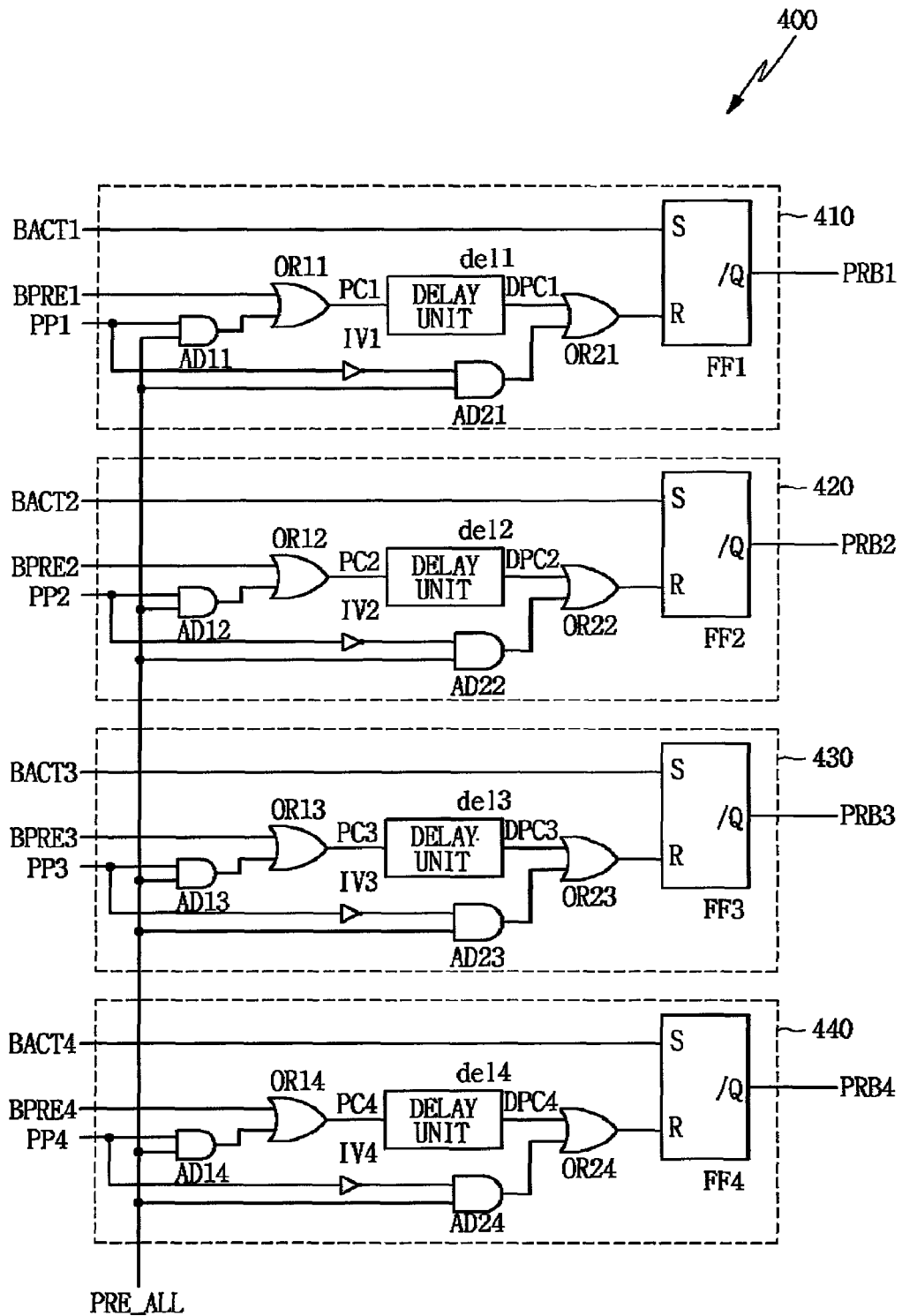
FIG. 6 is a diagram of the final precharge signal generator of FIG. 2, according to an exemplary embodiment.

FIG. 6 is a diagram of the final precharge signal generator 400 of FIG. 2, according to an exemplary embodiment. The final precharge signal generator 400 may include first through fourth final precharge generators 410, 420, 430, 440, which include inverters IV1, IV2, W3, W4, delay units del1, del2, del3, del4, first AND gates AD11, AD12, AD13, AD14, second AND gates AD21, AD22, AD23, AD24, first OR gates OR11, OR12, OR13, OR14, second OR gates OR21, OR22, OR23, OR24, and flip-flops FF1, FF2, FF3, FF4, respectively.

The first AND gates AD11, AD12, AD13, AD24 may perform a logic AND on the all-bank precharge command PRE_ALL, which is applied from the command decoder 6, and the corresponding precharge priority signals PP1, PP2, PP3, PP4. The first OR gates OR11, OR12, OR13, OR14 may perform a logic OR on the bank precharge signals BPRE1, BPRE2, BPRE3, BPRE4, which designate precharge operations of the respective banks of the semiconductor memory device, and the output signals of the corresponding first AND gates AD11, AD12, AD13, AD24 and output precharge control signals PC1, PC2, PC3, PC4. In this case, the bank precharge signals BPRE1, BPRE2, BPRE3, BPRE4, which designate not the all-bank precharge operation but the precharge operations of the respective banks, may be generated by a combination of a precharge command applied from the command decoder 6 and a bank address applied from the address register 1.

The delay units del1, del2, del3, del4 may receive the corresponding precharge control signals PC1, PC2, PC3, PC4, delay the precharge control signals PC1, PC2, PC3, PC4 for a predetermined delay time, and output delayed precharge control signals DPC1, DPC2, DPC3, DPC4, respectively. The delay units del1, del2, del3, del4 may be embodied in various ways. For example, the delay units del1, del2, del3, del4 may be a plurality of inverters connected in series. The inverters IV1, IV2, IV3, IV4 may invert the corresponding precharge priority signals PP1, PP2, PP3, PP4 and output inverted precharge priority signals, respectively, and the second AND gates AD21, AD22, AD23, AD24 may perform a logic AND on the inverted precharge priority signals, which are output from the corresponding inverters IV1, IV2, IV3, IV4, and the all-bank precharge command PRE_ALL.

Also, the second OR gates OR21, OR22, OR23, OR24 may perform a logic OR on the delay precharge control signals DPC1, DPC2, DPC3, DPC4, which are output from the corresponding delay units del1, del2, del3, del4, and the output signals of the second AND gates AD21, AD22, AD23, AD24.

The flip-flops FF1, FF2, FF3, FF4 may receive the corresponding ones of bank active signals applied from the active order latch unit 100 through set terminals S thereof, receive output signals of the corresponding second OR gates OR21, OR22, OR23, OR24 through reset terminals R thereof, activate final precharge signals PRB1, PRB2, PRB3, PRB4 at different times, and output the activated signals.

The operation of the final precharge signal generator 400 will now be described with reference to FIG. 6. When banks corresponding to the respective flip-flops FF1, FF2, FF3, FF4 are activated, the flip-flops FF1, FF2, FF3, FF4 may deactivate the final precharge signals PRB1, PRB2, PRB3, PRB4 to a low level in response to the bank active signals BACT1, BACT2, BACT3, BACT4, respectively.

Thereafter, when the first bank precharge signal BPRE1 is activated to a high level and applied to the final precharge signal generator 400, the first OR gate OR11 may output a high-level precharge control signal PC1, and the delay unit del1 may delay the precharge control signal PC1 for a predetermined time, send a delayed precharge control signal DPC1 to a high level. The second OR gate OR21 may apply a high-level signal to the reset terminal R of the flip-flop FF1 in response to the delayed precharge control signal DPC1, and the flip-flop FF1 may send the first final precharge signal PRB1 to a high level and output the high-level first final precharge signal PRB1. That is, when the bank precharge signals BPRE1, BPRE2, BPRE3, BPRE4 for designating precharge operations of the respective banks are applied to the final precharge signal generator 400, the first through fourth final precharge generators 410, 420, 430, 440 may activate and output the final precharge signals PRB1, PRB2, PRB3, PRB4 after the elapse of a predetermined time.

However, when the all-bank precharge command PRE_ALL is applied, the precharge order determiner 300 of FIG. 5 may activate and output two of the first through fourth precharge priority signals PP1, PP2, PP3, PP4 and deactivate and output the remaining two thereof. For example, when the first and second precharge priority signals PP1, PP2 are activated to a low level and applied, and the third and fourth precharge priority signals PP3, PP4 are deactivated and applied, only two first AND gates AD13, AD14 of the first AND gates AD11, AD12, AD13, AD24 may output high-level signals, while the remaining two first AND gates AD11, AD12 may output low-level signals. Thus, two first OR gates OR13, OR14 of the first OR gates OR11, OR12, OR13, OR14 may output high-level precharge control signals PC3, PC4, while the remaining two first OR gates OR11, OR12 thereof may output low-level precharge control signals PC1, PC2.

Meanwhile, since the second AND gates AD21, AD22, AD23, AD24 receive inverted precharge priority signals through the respectively corresponding inverters IV1, IV2, IV3, IV4, the second AND gates AD21, AD22 may output high-level signals, while the second AND gates AD23, AD24 may output low-level signals.

The second OR gates OR21, OR22 may receive the high-level signals from the second AND gates AD21, AD22 and directly apply the high-level signals to the reset terminals R of the flip-flops FF1, FF2. Conversely, since low-level signals are applied from the second AND gates AD23, AD24, only when high-level delay precharge control signals DPC3, DPC4 are applied from the delay units del3, del4, the second OR gates OR23, OR24 may apply the high-level signals to the reset terminals R of the flip-flops FF3, FF4. Thus, the first and second final precharge signals PRB1, PRB2 are directly activated in response to the all-bank precharge signal PRE_ALL, but the third and fourth final precharge signals PRB3, PRB4 may be activated after the elapse of the predetermined time in the same manner as when the respective bank precharge signals BPRE1, BPRE2, BPRE3, BPRE4 are applied. As a result, the first and second banks may start a precharge operation first, and the third and fourth banks may start the precharge operation later. Thus, since all the banks do not start the precharge operation simultaneously, power noise may be reduced.

Although the finally activated or written bank may be precharged after the elapse of a predetermined delay time, the remaining banks may start the precharge operation without the elapse of the delay time or after the elapse of a shorter delay time. Therefore, a semiconductor memory device according to an exemplary embodiment may reduce power noise, while maintaining the full operating speed of the semiconductor memory device about as high as the conventional semiconductor memory device.

The semiconductor memory device described above includes four banks, and during an all-bank precharge operation, two of the banks start a precharge operation first, while the remaining two of the banks start the precharge operation later. In other words, two precharge start times are set during the all-bank precharge operation. However, the number of banks of a semiconductor memory device is not limited to four. Also, three or more precharge start times may be set during the all-bank precharge operation. For example, when a semiconductor memory device includes n banks (n being a natural number), the respective banks may start the precharge operation at 2 to n different times during the all-bank precharge operation.

Although the precharge start times of the respective banks have been described as controlled based upon two standards, that is, the active and write orders of the respective banks, the precharge start times of the respective banks may be controlled according to each of the active and write orders.

Also, it has been described above that the semiconductor memory device controls the precharge start times of the respective banks only during the all-bank precharge operation. However, the semiconductor memory device may precharge at least two banks simultaneously even during an individual-bank precharge operation. Even when two or more banks are precharged simultaneously during an individual-bank precharge operation, the precharge controller may be configured to differently control the precharge start times of the respective banks.

Furthermore, during a single-bank precharge operation or a plural-bank precharge operation, precharge start times of a plurality of blocks included in each of the banks may be controlled differently such that the respective blocks may start a precharge operation at different times. When the precharge start times of the plurality of banks included in each of the banks are controlled differently, the plurality of blocks may be sequentially precharged instead of determining an active or write order of the respective blocks.

Figure 7:
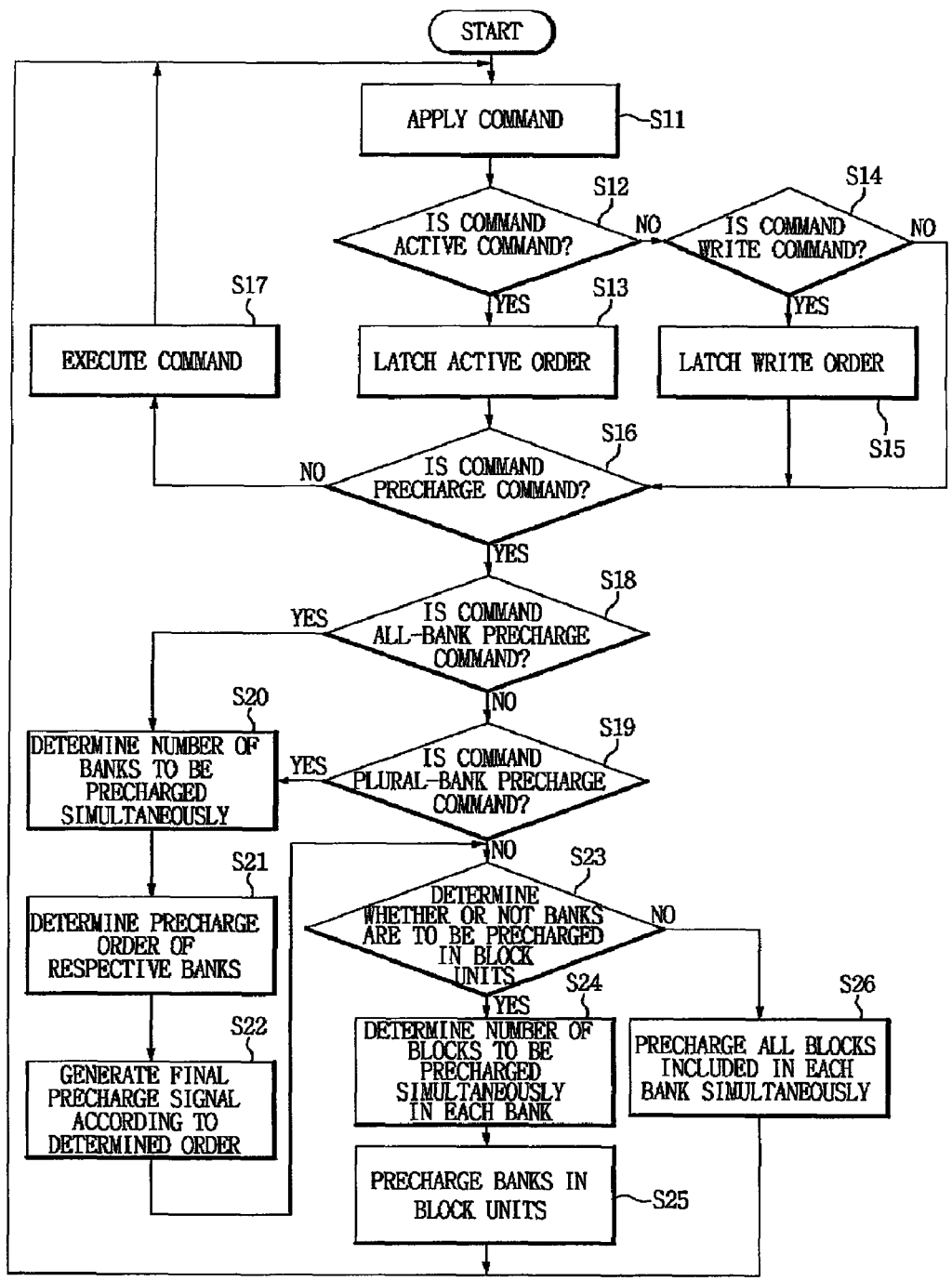
FIG. 7 is a flowchart illustrating a precharge method of a semiconductor memory device according to an exemplary embodiment.

FIG. 7 is a flowchart illustrating a precharge method of a semiconductor memory device according to an exemplary embodiment. When the semiconductor memory device starts its operations, a command is applied (S11) and a determination is made as to whether or not the received command is an active command ACT (S12). When the received command is the active command ACT, the semiconductor memory device may activate a bank designated by a bank address BA applied along with the active command ACT and latch an active order (S13). When the received command is not the active command ACT, the semiconductor memory device may determine whether or not the received command is a write command WR (S14). When the received command is the write command WR, the semiconductor memory device may write the bank designated by the bank address BA applied along with the write command WR and latch a write order (S15). Also, when the received command is neither the active command ACT nor the write command WR, the semiconductor memory device may determine whether or not the received command is a precharge command (S16). When the received command is not the precharge command, the semiconductor memory device may execute the received command (S17) and receive and apply the following command (S11).

However, when the received command is the precharge command, the semiconductor memory device may determine whether the precharge command is an all-bank precharge command or an individual-bank precharge command (S18), and when the received command is not the all-bank precharge command, the semiconductor memory device may determine whether or not the precharge command is a plural-bank precharge command (S19). When the all-bank precharge command or the plural-bank precharge command is applied, the semiconductor memory device may determine a precharge order of the respective banks to be precharged (S20). In this case, the precharge order of the respective banks may be determined based upon the latched active order (S13) and the latched write order (S15). For example, after the precharge order is determined based upon the active order by giving priority to the latched active order (S13), a write order may be applied to the banks in the same active order. Conversely, priority may be given to the write order. Also, the active order (S13) and the write order (S15) may be sequentially applied or have the same priority.

When the precharge order of the respective banks to be precharged is determined (S20), the number of banks to be precharged simultaneously may be determined (S21). Here, when the all-bank precharge command is applied, the number of banks to be precharged simultaneously may be set to 1 to n (n being the number of the banks). When the number of banks to be precharged simultaneously is set to 1, all the banks may be precharged at respectively different times. When the number of banks to be precharged simultaneously is set to n, all the banks may be precharged simultaneously. Similarly, when the plural-bank precharge command is applied, the number of banks to be precharged simultaneously may be set to 1 to m (m being the number of banks designated by the plural-bank precharge command to be precharged).

When the number and order of the banks to be precharged simultaneously are determined, final precharge signals for banks to be precharged according to the determined number and order of the banks may be sequentially activated (S22). In this case, when a plurality of final precharge signals are set according to the number of banks to be precharged, the plurality of final precharge signals may be activated simultaneously. That is, as in the embodiment of FIG. 6, the final precharge signals may be sequentially activated by twos.

When the final precharge signals are activated (S22) or the applied command is a single-bank precharge command (S19), it may be determined whether a plurality of blocks included in each of the banks corresponding to the activated final precharge signals or a bank corresponding to the single-bank precharge command are to be precharged simultaneously or to be precharged in block units at different times (S23).

When the plurality of blocks are to be precharged in block units, the number of blocks to be precharged simultaneously in each of the banks may be determined (S24), and the blocks may be precharged in block units according to the determined number of blocks (S25). However, when the plurality of blocks are not to be precharged in block units, all the blocks included in each of the banks may be precharged simultaneously (S26). Also, when the corresponding bank is completely precharged, it may be determined whether the precharged bank is a final bank to be precharged (S27). When the precharged bank is the final bank, the semiconductor memory device may return to the command application of operation S11. When the precharged bank is not the final bank, it may be determined whether blocks included in a next bank are to be precharged simultaneously or to be precharged in block units at different times (S23).

The activated or deactivated levels of the above-described respective signals may vary according to semiconductor memory devices.

Therefore, a semiconductor memory device according to the above-described exemplary embodiments may latch an active or write order of a plurality of banks and control precharge start times of the respective banks according to the latched active or write order during a plurality of bank precharge operations including an all-bank precharge operation, thereby activating a stable bank precharge operation. Furthermore, during the individual-bank precharge operation, precharge start times of respective blocks included in each of the banks may be controlled differently, thereby minimizing power noise.

While exemplary embodiments have been disclosed herein, it should be understood that other variations may be possible. Such variations are not to be regarded as a departure from the spirit and scope of exemplary embodiments of the present application, and all such modifications as would be apparent to one skilled in the art are intended to be included within the scope of the following claims.

What is claimed is:

1. A precharge method of a semiconductor memory device comprising n banks, n being a natural number equal to or greater than 2, the method comprising:
   latching an active order of the n banks in response to a bank address applied along with an active command when the active command is applied;
   determining whether or not a precharge command is given to precharge m banks, m being a natural number equal to or greater than 2 and equal to or less than n, when the precharge command is applied;
   setting the number of banks to be precharged simultaneously to i, i being a natural number equal to or greater than 1 and equal to or less than m, when the precharge command is given to precharge the m banks;
   determining a precharge order of the respective m banks based upon the latched active order and sequentially activating m final precharge signals in groups of i according to the determined precharge order; and
   starting precharging the m banks at different times in response to the sequentially activated m final precharge signals.

2. The method of claim 1, further comprising latching a write order of the n banks in response to the bank address applied along with a write command when the write command is applied.

3. The method of claim 2, wherein activating the final precharge signals comprises determining the precharge order of the respective m banks based upon the latched active order and the latched write order.

4. The method of claim 1, wherein the precharge command given to precharge the plurality of banks is an all-bank precharge command for precharging all the n banks.

5. The method of claim 1, wherein the precharge command given to precharge the m banks is applied simultaneously with bank addresses for the in banks.

6. The method of claim 1, wherein starting precharging the m banks comprises:
   determining whether or not a plurality of blocks included in each of the banks corresponding to the activated final precharge signals are to be precharged in block units;
   precharging all the blocks included in each of the banks simultaneously when the blocks are not to be precharged in block units;
   determining the number of the blocks to be precharged simultaneously when the blocks are to be precharged in block units; and
   sequentially precharging the plurality of blocks included in each of the banks by the determined number of blocks to be precharged simultaneously.

7. The method of claim 6, further comprising:
   determining whether or not the plurality of blocks included in each of the banks to be precharged are to be precharged in block units when the precharge command is a single-bank precharge command;
   simultaneously precharging all the blocks included in each of the banks when the plurality of blocks are not to be precharged in block units;
   determining the number of the blocks to be precharged simultaneously when the plurality of blocks are to be precharged in block units; and
   sequentially precharging the plurality of blocks included in each of the banks by the determined number of blocks to be precharged simultaneously.

8. A semiconductor memory device comprising:
   n banks, n being a natural number equal to or greater than 2;
   a command decoder configured to decode an externally applied command and output an active command and a precharge command; and
   a precharge controller configured to receive a bank address and the active command, latch an active order of the n banks, and output m final precharge signals, which are activated at different start times in groups of i, i being a natural number equal to or greater than 1 and equal to or less than m and m being a natural number equal to or greater than 2 and equal to or less than n, according to the latched active order when the precharge command for precharging m banks is applied,
   wherein the n banks start precharge operations in response to the corresponding m final precharge signals.

9. The device of claim 8, wherein the precharge controller comprises:
an active order latch unit configured to receive the bank address and the active command, to latch the active order of the n banks, and to activate the n final bank active signals according to the latched active order;
a precharge order determiner configured to determine a precharge order of the n banks in response to the n final bank active signals, to activate n precharge priority signals according to the determined precharge order, and to output the activated precharge priority signals; and
a final precharge signal generator configured to activate the m final precharge signals at different start times in groups of i in response to the n precharge priority signals and the precharge command.

10. The device of claim 9, wherein the precharge controller further comprises a write order latch unit configured to receive the bank address and a write command, which is further output from the command decoder, to latch a write order of the n banks, and to output n final bank write signals according to the latched write order, and
wherein the precharge order determiner outputs the n precharge priority signals in response to the n final bank write signals in addition to the n final bank active signals.

11. The device of claim 10, wherein the active order latch unit comprises n active latch units,
wherein each of the n active latch units comprises:
a first AND gate configured to perform a logic AND on the corresponding bank address and the active command and to output a corresponding bank active signal;
a first OR gate configured to perform a logic OR on the bank active signals other than the corresponding bank active signal; and
a first flip-flop configured to activate the corresponding final bank active signal in response to the output signal of the first AND gate, and to deactivate the final bank active signal in response to the output signal of the first OR gate.

12. The device of claim 11, wherein the write order latch unit comprises n write latch units,
wherein each of the n write latch units comprises:
a second AND gate configured to perform a logic AND on the corresponding bank address and the write command and to output a corresponding bank write signal;
a second OR gate configured to perform a logic OR on the bank write signals other than the corresponding bank write signal; and
a second flip-flop configured to activate the corresponding final bank write signal in response to the output signal of the second AND gate, and to deactivate the final bank write signal in response to the output signal of the second OR gate.

13. The device of claim 12, wherein the precharge order determiner comprises n precharge priority signal generators,
wherein each of the n precharge priority signal generators comprises:
a third AND gate configured to receive the final bank active signal and the final bank write signal, which correspond to one of the banks other than the corresponding bank, and to perform a logic AND on the received signals; and
a third OR gate configured to perform a logic OR on the output signal of the third AND gate, the corresponding final bank active signal, and the corresponding final bank write signal, and to output the precharge priority signal,
wherein the n third AND gates respectively receive different final bank active signals and final bank write signals.

14. The device of claim 13, wherein the final precharge signal generator comprises n final precharge generators,
wherein each of the n final precharge generators comprises:
a fourth AND gate configured to perform a logic AND on the bank precharge command and the corresponding one of the n precharge priority signals;
a fourth OR gate configured to perform a logic OR on a bank precharge signal, which is generated by combining the corresponding bank address with the precharge command further output from the command decoder, and the output signal of the fourth AND gate, and to output a precharge control signal;
a delay unit configured to delay the precharge control signal for a predetermined delay time, and to output a delayed precharge control signal;
a first inverter configured to invert the corresponding precharge priority signal, and to output an inverted precharge priority signal;
a fifth AND gate configured to perform a logic AND on the output signal of the first inverter and an all-bank precharge command;
a fifth OR gate configured to perform a logic OR on the delayed precharge control signal and the output signal of the fifth AND gate; and
a third flip-flop configured to deactivate the corresponding final precharge signal in response to the corresponding bank active signal, and to activate the corresponding final precharge signal in response to the output signal of the fifth OR gate.

15. A semiconductor memory array device, comprising:
a memory cell array comprising a plurality of memory banks;
a plurality of row decoders coupled to respective memory banks, the row decoders being responsive to a bank selection signal that activates a row decoder in response to a bank address, and a row address signal; and
pre-charge controller responsive to the bank address and commands, including at least a bank precharge command for pre-charging individual banks and an all-bank precharge command for precharging all banks,
wherein when the all-bank precharge command or the bank precharge command is applied to the pre-charge controller the precharge controller determines the precharge order of the plurality of banks to be precharged, activates a plurality of precharge signals corresponding respectively to the plurality of banks such that the respective banks are precharged according to a determined precharge order, and outputs the activated precharge signals to the row decoder,
wherein the precharge controller controls an activation start time of the bank precharge signal such that during the all-bank precharge operation selected banks are precharged before remaining banks are precharged.

16. A semiconductor memory array device, comprising:
a memory cell array comprising a plurality of memory banks;
a plurality of row decoders coupled to respective memory banks, the row decoders being responsive to a bank selection signal that activates a row decoder in response to a bank address, and a row address signal; and
a pre-charge controller responsive to the bank address and commands, including at least a bank precharge command for pre-charging individual banks and an all-bank precharge command for precharging all banks,
wherein when the all-bank precharge command or the bank precharge command is applied to the pre-charge controller the precharge controller determines the precharge order of the plurality of banks to be precharged, activates a plurality of precharge signals corresponding respectively to the plurality of banks such that the respective banks are precharged according to a determined precharge order, and outputs the activated precharge signals to the row decoder, wherein the precharge controller controls an activation start time of the bank precharge signal such that during a simultaneous precharge operation of a plurality of banks, some of the plurality of banks are precharged before remaining banks are precharged.

* * * * *